United States Patent [19]
Birx et al.

[11] Patent Number: 5,448,580
[45] Date of Patent: Sep. 5, 1995

[54] AIR AND WATER COOLED MODULATOR

[75] Inventors: Daniel L. Birx, Oakley; Phillip A. Arnold, Livermore; Don G. Ball, Livermore; Edward G. Cook, Livermore, all of Calif.

[73] Assignee: The United States of America as represented by the United States Department of Energy, Washington, D.C.

[21] Appl. No.: 270,718

[22] Filed: Jul. 5, 1994

[51] Int. Cl.⁶ .................................................. H01S 3/00
[52] U.S. Cl. ............................................. 372/38; 372/37
[58] Field of Search ..................................... 372/38, 37

[56] References Cited

U.S. PATENT DOCUMENTS

| | | |
|---|---|---|
| 5,140,602 | 8/1992 | O'Loughlin ............ 372/37 |
| 5,177,754 | 1/1993 | Ball et al. ............... 372/38 |
| 5,189,678 | 2/1993 | Ball et al. ............... 372/28 |
| 5,309,462 | 5/1994 | Taylor et al. ........... 372/37 |
| 5,315,611 | 5/1994 | Ball et al. ............... 372/38 |

Primary Examiner—Leon Scott, Jr.
Attorney, Agent, or Firm—Miguel A. Valdes; William C. Daubenspeck; William R. Moser

[57] ABSTRACT

A compact high power magnetic compression apparatus and method for delivering high voltage pulses of short duration at a high repetition rate and high peak power output which does not require the use of environmentally unacceptable fluids such as chlorofluorocarbons either as a dielectric or as a coolant, and which discharges very little waste heat into the surrounding air. A first magnetic switch has cooling channels formed therethrough to facilitate the removal of excess heat. The first magnetic switch is mounted on a printed circuit board. A pulse transformer comprised of a plurality of discrete electrically insulated and magnetically coupled units is also mounted on said printed board and is electrically coupled to the first magnetic switch. The pulse transformer also has cooling means attached thereto for removing heat from the pulse transformer. A second magnetic switch also having cooling means for removing excess heat is electrically coupled to the pulse transformer. Thus, the present invention is able to provide high voltage pulses of short duration at a high repetition rate and high peak power output without the use of environmentally unacceptable fluids and without discharging significant waste heat into the surrounding air.

17 Claims, 7 Drawing Sheets

AIR AND WATER COOLED MODULATOR

GOVERNMENT RIGHTS

The United States Government has rights in this invention pursuant to Contract No. W-7405-ENG-48 between the United States Department of Energy and the University of California.

TECHNICAL FIELD

The present invention relates generally to electronic power supply devices and more particularly to an improved high average power magnetic modulator. While originally designed to be used in conjunction with metal vapor lasers, utility has been extended to other fields such as gas cleanup and ozone generation.

BACKGROUND OF THE INVENTION

It has become recognized that pulsed power supplies employing magnetic compression circuits or modulators, are appropriate for use with high power applications such as, for example, pulsed lasers. Even though such power supplies are more expensive and more complex than many other known types of modulators, the high reliability found in modulators employing magnetic switches makes them well suited for critical applications. Furthermore, the improvement in reliability of magnetic switch modulators over conventional electronic pulsed power supply devices using thyratrons, or the like, is especially prevalent in applications which require very high power output. One example of such a magnetic compression circuit, particularly adapted for high efficiency operation as a laser driving circuit, is found in U.S. Pat. No. 5,177,754 issued to Ball et al.

Traditionally, low power modulators have relied on forced air cooling methods. As power levels increase, the limits of air cooling are quickly reached. High average power magnetic compression circuits generate a great deal of heat, and produce very high voltages. Therefore, prior art high average power magnetic compression circuits have been designed to be operated immersed in a liquid dielectric fluid such as, for example, fluorocarbon dielectric fluids. These dielectric fluids both improve voltage hold off and act as a coolant for the high average power magnetic compression circuits. However, known fluorocarbon dielectric fluids present environmental problems and, as a result, are being removed from the market. Additionally, many prior art high average power magnetic compression circuits discharge waste heat into the surrounding air. Such a discharge of waste heat can adversely affect surrounding components such as, for example, finely tuned optical components. Therefore, it is desirable to produce a high average power magnetic compression circuit which can operate without the use of such fluorocarbon dielectric fluids and which does not discharge significant amounts of waste heat into the vicinity immediately surrounding the high average power magnetic compression circuit. However, previous efforts to produce a reliable device which can provide the necessary power for high power applications, without requiring the use of fluorocarbon dielectric and coolant fluid have been less than completely successful.

Attempts to create such a device have been made using primary switching stages which employ thyratron switches. A thyratron is a gas-filled, hot-cathode electron tube designed for operation at high voltages, high repetition rates, and short time duration conduction pulses. Thyratrons were originally developed for radar modulator applications. However, as additional devices were developed to expand their operational range, that is their peak and average power, repetition rate, current rate of rise (dI/dt) capability, maximum operating voltage, etc., thyratrons found use in a variety of modulator applications. Unfortunately, due to the inherently finite life of such thyratron switches such devices have proven to be less than optimal. Solid state devices have also been tried but these devices generally lack the ability to deliver the instantaneous power and/or rate of change of current which is required.

Early modulators designed for driving copper lasers were based on capacitor inversion circuits. Modulators of this type are still often used in non critical short term experiments. Capacitor inversion circuits are designed to deliver to the laser a voltage pulse having a 40–60 nanosecond (ns) risetime, a duration of 150–200 ns, and a peak amplitude of 20–40 kilovolts (kV). The main commutation switch for these circuits was usually a thyratron.

At an average power level of approximately 10 kW, the peak current and dI/dt of a thyratron in a capacitor inversion circuit (conduction time of 40–100 ns) is extremely high and results in accelerated cathode depletion, gas cleanup, and anode erosion. Thus, as the average input power of modulators approaches the 10 kW level, thyratron lifetimes become too short to perform meaningful long-term experiments. This short thyratron lifetime can be partially alleviated by electrically connecting a non-linear switching element, a magnetic assist, in series with the thyratron. The magnetic assist functions to delay the onset of electrical current for a short time, usually less than 100 ns, while the thyratron is in the formative turn-on process.

To further reduce the electrical stress on the thyratron, a single stage of magnetic compression is often added to a thyratron commutated circuit. In such a circuit implementation, the value of the peak current and dI/dt is linearly reduced by the gain of the magnetic switch. The gain of the magnetic switch is defined as the ratio of the hold-off time to the time required to transfer energy through the switch after saturation of the magnetic core. The functioning of this type circuit is set forth in detail in U.S. Pat. No. 5,189,678 entitled "Coupling Apparatus for a Metal Vapor Laser" to D. G. Ball and J. L. Miller.

At higher average power levels, thyratron commutated multi-stage magnetic compression circuits can be used. However, these circuits, like the prior art compression circuits, are usually immersed in a liquid dielectric/coolant to handle the heat load of the components and prevent electrical breakdown due to high voltage. Such thyratron commutated multi-stage magnetic compression circuits are used, for example, in the Laser Demonstration Facility (LDF) of the Atomic Vapor Laser Isotope Separation (AVLIS) Program at Lawrence Livermore National Laboratory. The use of such non-linear magnetic devices substantially reduces the peak current and dI/dt on the thyratron, and results in an increase in the useful life by extending the conduction pulse to a 1 $\mu$s duration. Mechanically, these circuits may be implemented in several ways as shown, for example, in U.S. Pat. No. 5,177,754 entitled "Magnetic Compression Laser Driving Circuit" to D. G. Ball et al. Even with the extended conduction time provided with magnetic compression circuits, operational experience indicates that the thyratron is still the major lifetime limiting component. Eventually, after examination of many switch options, a thyratron replacement which consists of a solid-state assembly fabricated as a series connected stack of 22 asymmetrical thyristors is employed in modulators used by the LDF at Lawrence Livermore Laboratory. This solid-state assembly is a very reliable and cost effective drop-in replacement for the thyratron.

A series stack of thyristors is an expensive assembly, so circuit designs which incorporate single solid state devices or an assembly of devices electrically connected in parallel are also used. Magnetic modulators of this circuit topology operate from low voltage power supplies, less than 1000 volts, and the high voltage required by the load is provided by a high-ratio stop-up transformer located in the magnetic modulator circuit. The conduction time of the thyristors is increased from the approximate 1 $\mu$s conduction time used in the LDF modulators to 5–10 $\mu$s in order to take advantage of the high average current capability of the solid state devices (i.e. silicon controlled rectifier (SCR), insulated gate bipolar transistor (IGBT), MOS controlled thyristor (MCT), etc . . . ) operating at the longer conduction times. Average power levels of modulators having this general topology range from 3 kW to approximately 100 kW. As with previous magnetic compression circuits, these designs are usually immersed in environmentally unacceptable CFC dielectric/coolants and require large, expensive, and heavy enclosures to contain both the circuit and the liquid dielectric/coolant.

Therefore a need exists for a compact, reliable, long life, high average power magnetic compression circuit, modulator, which can deliver high voltage pulses of short duration at a high repetition rate and high peak power output which does not require the use of environmentally unacceptable fluids such as chlorofluorocarbons either as a dielectric or as a coolant, and which discharges very little waste heat into the surrounding air.

SUMMARY OF THE INVENTION

It is, therefore, an object of the present invention to provide a compact, reliable, high average power magnetic compression circuit, modulator, having a lifetime greater than 5000 hours, with an average power greater than 8 kW, which can deliver at least 20 kV voltage pulses of less than 200 ns duration at a repetition rate greater than 4 kHz and peak power output of at least 5 MW. Additionally, the present invention does not require the use of environmentally unacceptable fluids such as chlorofluorocarbons either as a dielectric or as a coolant, and discharges very little waste heat into the surrounding air. This object has been accomplished by a solid state switched magnetic compression circuit employing printed circuit board technology to control stray inductance and to provide well-defined impedances, which also has a physical layout which provides sufficient cooling using air and fluids such as, for example, water as coolants. The present invention also utilizes a small amount of oil as an impregnant and a dielectric/heat transfer fluid in a sealed switch geometry. The vast majority of waste heat is removed with cooling water and is not discharged into the vicinity immediately surrounding the modulator.

To insure adequate reliability over an extended operating life, solid state switch control devices are used to trigger the first stage compression circuit. The present invention also employs a multi-primary transformer which provides a high voltage step-up ratio yet maintains a high frequency, high fidelity response. Further, the voltage step-up is flexible by either increasing or decreasing the number of primaries. In addition, single or multiple secondary turns may be employed. Furthermore, the transformer has a flexible output configuration permitting unipolar (positive or negative with respect to ground) or bipolar (both positive and negative voltage with respect to ground) operation. Also, the geometry of the multi-primary transformer isolates the high voltage of the secondary winding from the printed circuit board on which the transformer is mounted. Furthermore, the transformer construction lends itself to efficient cooling of the conductors and magnetic core material.

The present invention also employs magnetic switches in which the magnetic core material is enclosed in water-cooled metal housings to permit efficient transfer of heat from the core to the housing. The excess heat is then extracted from the housing by the cooling water. As an additional benefit, the metal housings provide tight magnetic coupling which results in low inductance by means of reduced stray inductance. Furthermore, the geometry of the magnetic switch of the present claimed invention increases the reproducibility of switch performance from one modulator to another.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
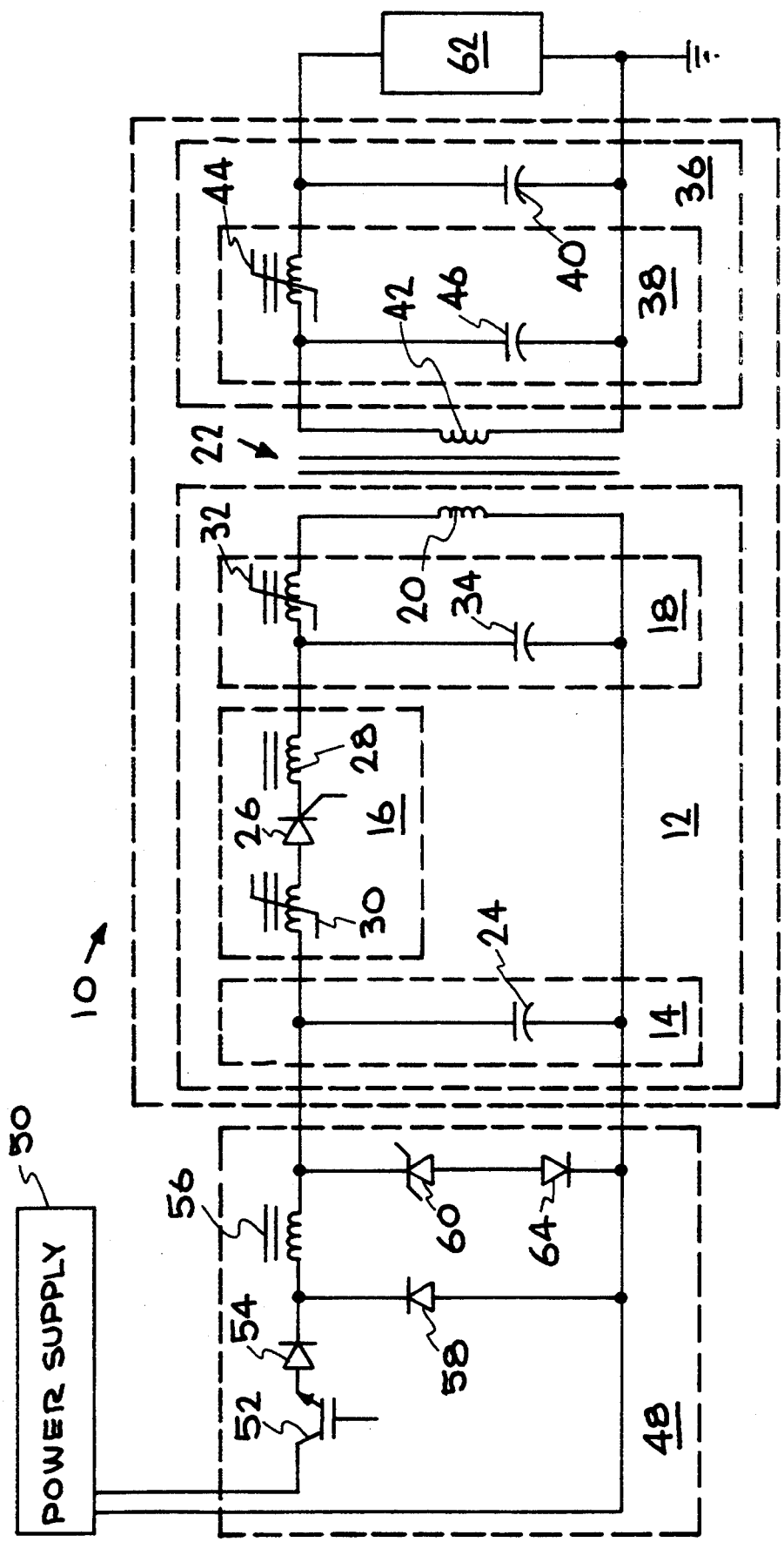
FIG. 1 is a schematic electrical diagram of an improved high average power magnetic compression circuit, modulator, in accordance with the present invention.

With reference next to FIG. 1, a schematic diagram of an improved high average power magnetic compression circuit 10, copper laser modulator, is shown. The present high average power magnetic compression device has utility in fields such as gas cleanup and ozone generation. However, for clarity only, the following discussion of the present improved high average power magnetic modulator will deal specifically with using the present high average power magnetic modulator for providing high voltage output pulses to metal vapor lasers, particularly copper vapor lasers.

With reference still to FIG. 1, the improved copper laser modulator 10 is comprised of a low voltage section 12, a pulse transformer 22 and an output assembly 36. Low voltage section 12 may be conceptualized as having an input portion 14, a switching portion 16, a first stage of magnetic compression (first stage) 18 and the multiple primaries 20 of pulse transformer 22. Input portion 14 consists of an input capacitor 24 comprised of multiple parallel capacitors. The switching portion 16 has a main silicon controlled rectifier (SCR) 26, a linear inductor 28 and a magnetic assist inductor 30. The first stage 18 has a first stage nonlinear switching inductor or "magnetic switch" 32 and an associated first stage capacitor 34. In addition, low voltage section 12 has therein parallel primary winding assemblies 20 of a pulse transformer 22.

With reference again to FIG. 1, output assembly 36 consists of a second stage 38 and a peaking capacitor 40. Output assembly 36 is coupled to low voltage section 12 by pulse transformer 22. The secondary winding 42 of transformer 22 is magnetically coupled to primary winding assembly 20. Output assembly 36 also has a second stage 38. Second stage 38 has a second stage magnetic switch 44 and a second stage capacitor 46. Second stage capacitor 46 discharges through second stage magnetic switch 44 into peaking capacitor 40.

As shown in FIG. 1, in the present embodiment 10 of the claimed invention, a charging circuit 48 switches power from an unregulated power supply 50 to low voltage section 12. Charging circuit 48 includes an Insulated Gate Bipolar Transistor (IGBT) 52, a series charging diode 54, a charging inductor 56, a free-wheeling diode 58, a zener diode 60, and a reverse blocking diode 64. In charging circuit 48, IGBT 52 acts as a primary switch. A charging inductor 56 limits dI/dt through IGBT 52 and determines the time required to charge input capacitor 24 in low voltage section 12. Zener diode 60 limits voltage at the output of charging circuit 48. Energy not dissipated in the load 62 during a pulse results in an inverse voltage on input capacitor 24. Reverse blocking diode 64 prevents current flow in zener diode 60 due to inverse voltage on input portion 14 of low voltage section 12. Free-wheeling diode 58 allows the inverse voltage on input capacitor 24 to reverse its polarity by discharging through charging inductor 56. In this fashion the energy is recovered for the next pulse.

With reference still to FIG. 1, in low voltage section 12, main SCR 26 acts as the primary controlled switch for first stage magnetic switch 32. The theory and operation of the magnetic switch stages is known in the art, and will not be discussed in detail herein. Pending U.S. patent application Ser. No. 07/898,105, a Continuation-In-Part of U.S. Pat. Nos. 5,189,678 and 5,177,754, discusses magnetic switch stages and the nuances of circuit timing for such switches, and is incorporated by reference herein. As one familiar with the operation of magnetic switches will recognize, input capacitor 24 of low voltage section 12 is charged by charging circuit 48 while the main SCR 26 of the low voltage section 12 is not conducting. The main SCR 26 is triggered by external timing mechanisms, not shown, to initiate conduction. Within low voltage section 12, magnetic assist inductor 30 serves to delay the rise of current through main SCR 26 until the device has had sufficient time to turn on more completely, thereby reducing power loss, and thus serving to enhance the life of the SCR 26. Linear inductor 28 is used to determine the time for the energy to transfer from input capacitor 24 to first stage capacitor 34.

With reference still to FIG. 1, first stage magnetic switch 32 and first stage capacitor 34 in low voltage section 12 compress the energy pulses generated by triggering main SCR 26. That is, the energy is transferred out of capacitor 34 and through first stage magnetic switch 32 at a rate which is faster than the rate at which energy was initially deposited on capacitor 34 by the triggering of main SCR 26. As previously discussed, the output of first stage 18 drives transformer primary winding assemblies 20 and is, therefore, coupled to second stage 38 through pulse transformer 22.

Referring still to FIG. 1, primary winding assembly 20 of the low voltage section 12 is magnetically coupled to secondary winding 42. In the present embodiment, pulse transformer 22 is a 1:24 step up transformer electrically configured as many single turn primary windings and secondary winding 42 which couples to each of the primary windings. The voltage appearing across the ends of secondary winding 42 is the algebraic product of the voltage appearing across the primary windings, the number of primary windings, and the number of turns in the secondary winding 42.

Figure 2:
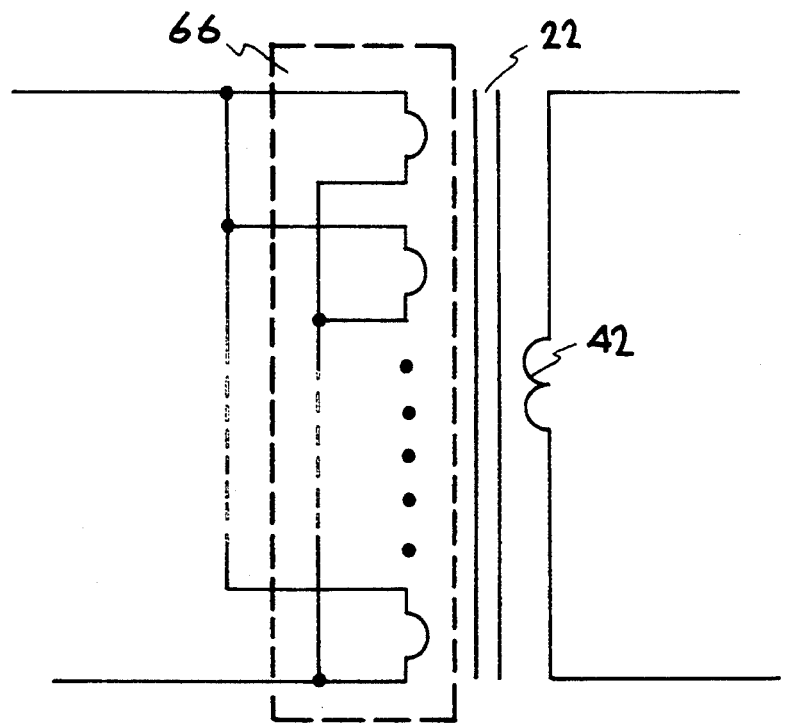
FIG. 2 is a schematic representation of the multiprimary transformer in accordance with the present invention.

With reference next to FIG. 2, pulse transformer 22 is shown in greater detail. In the present embodiment, there are twelve primary windings 66 and two turns in the secondary winding 42 for a voltage step-up ratio of 1:24.

Referring again to FIG. 1, second stage 38 of magnetic compression typically operates at a positive voltage with respect to a ground. Second stage 38 consists of second stage input capacitor 46 and second stage magnetic switch 44 connected to secondary winding 42 of pulse transformer 22 such that a positive output pulse will be produced across peaking capacitor 40 when second stage magnetic switch 44 saturates.

Listed below are items A-P setting forth the relevant type and electrical value information for the major electrical components employed in the present embodiment of the invention.

A. BLOCKING DIODE (54), FREE-WHEELING DIODE (58)-fast recovery device manufactured by Powerex (Part#CS641230) with a blocking voltage of 1200V, 300 A (ave.) current and a recovery time of 800 ns.

B. REVERSE BLOCKING DIODE (64)-fast recovery device manufactured by Powerex (Part#R6221230) which has a blocking voltage of 1200 V, a current carrying capacity of 300 A (ave.), and a 500 ns recovery time.

C. LOW VOLTAGE MODULE INPUT CAPACITORS (24)-0.1[μF, 1600 Volt, Roederstein KP1836 B5, IMB LP8573 or equivalent.

D. MAIN SCR (26)-Westcode Part#R400CH12 or equivalent.

E. MAGNETIC ASSIST INDUCTOR (30)-2 sets of parallel turns wound on a MnZn ferrite core, 5 each of 0.875" inner diameter×1.165" outer diameter×0.3" thick toroids (material type Ferroxcube Type 3E2A or equivalent).

F. LINEAR INDUCTOR (28)-4 sets of 6 turns on a 26 μmoly permalloy powder (MPP) core with inner diameter 1.938", outer diameter 3.063" and 0.5" thickness. Windings are composed of #10 AWG Litz wire.

G. FIRST STAGE MAGNETIC SWITCH (NON-LINEAR INDUCTOR) (32)-Oil-impregnated, single turn structure wound with Allied Corp. Metglas Type 2605 SC magnetic material insulated turn-to-turn with 0.1 mil thick Mylar plastic film.

H. FIRST STAGE INPUT CAPACITOR (34)-0.1 μF, 1600 Volt, Roederstein KP1836- B5, IMB LP8573 or equivalent.

I. PULSE TRANSFORMER (22)-1:24 step up-12 single-turn primaries in parallel; 1 each 2-turn secondary.

Secondary Windings: A metal tube disposed within the primary mandrels connected to a metal rod disposed within the metal tube.

Transformer Core: Allied Corp. Metglas Type 2605 S3A magnetic material spirally wrapped around each primary mandrel to form a magnetic core of toroidal geometry. Mylar film serves as the dielectric between adjacent turns of Metglas.

J. SECOND STAGE INPUT CAPACITORS (46)- TDK UHV-1A (1400 pF, 20 kV).

K. SECOND STAGE MAGNETIC SWITCH (44)- Six-turn coaxial, four-winding structure with ferrite toroidal core, core material Ceramic Magnetics Type CMD5005 NiZn ferrite or equivalent.

L. PEAKING CAPACITOR (40)-TDK UHV-1A (1400 pF, 20 kV).

M. POWER SUPPLY (50)-300 to 650 V, 10 kW.

N. IGBT (52)-Powerex CM200HA-24E, 1200 V, 200 A.

O. CHARGING INDUCTOR (56)-Air-gapped nickel-Iron C-core with an inductance of 450 mH.

P. ZENER DIODE (60)-8 each International Rectifier 150 V, 500 W zener diodes, Part#500-PZA150B.

Figure 3A:
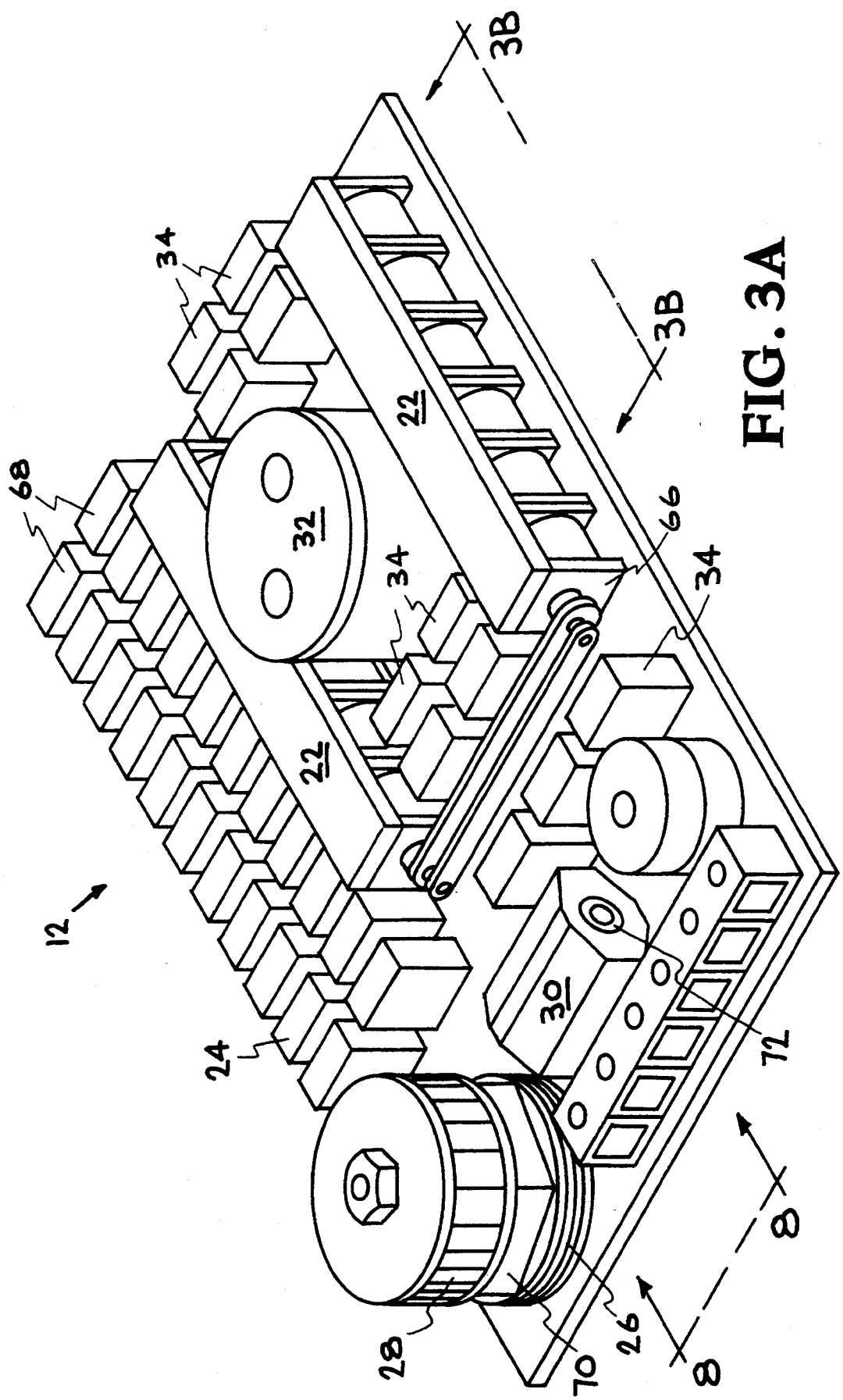
FIG. 3A is a perspective view of a low voltage assembly in accordance with the present invention.

With reference next to FIG. 3A, a perspective view of the low voltage section 12 of the present embodiment of the present invention is shown. Water-cooled cold plates 70 are attached on both ends of main SCR 26 for carrying heat therefrom. In the present embodiment, low voltage module input capacitors 24 and first stage input capacitors 34 are mounted in banks to printed circuit (PC) boards having heavy, 6 oz., copper cladding. As shown in FIG. 3A, in the present embodiment, capacitor banks 24 and 34 are each actually arrays, respectively composed of forty-one and forty-four individual capacitors 68 connected in parallel.

With reference still to FIG. 3A, magnetic assist inductor 30 is connected to main SCR 26. Magnetic assist inductor 30, in the present embodiment comprises two sets of parallel windings around a plurality of toroids which comprise the common magnetic assist core 72. The lead lengths of magnetic assist inductor 30 are identical so that the total loop inductance is the same. Core 72 is reset by passing current through a single turn of insulated wire which passes through the center of the toroids. Linear inductor 28 is connected in series with main SCR 26. Linear inductor 28 has four parallel windings, each with 6 turns. Additionally, in the present embodiment, linear inductor 28 is wound with Litz wire on an MPP core.

Figure 3B:
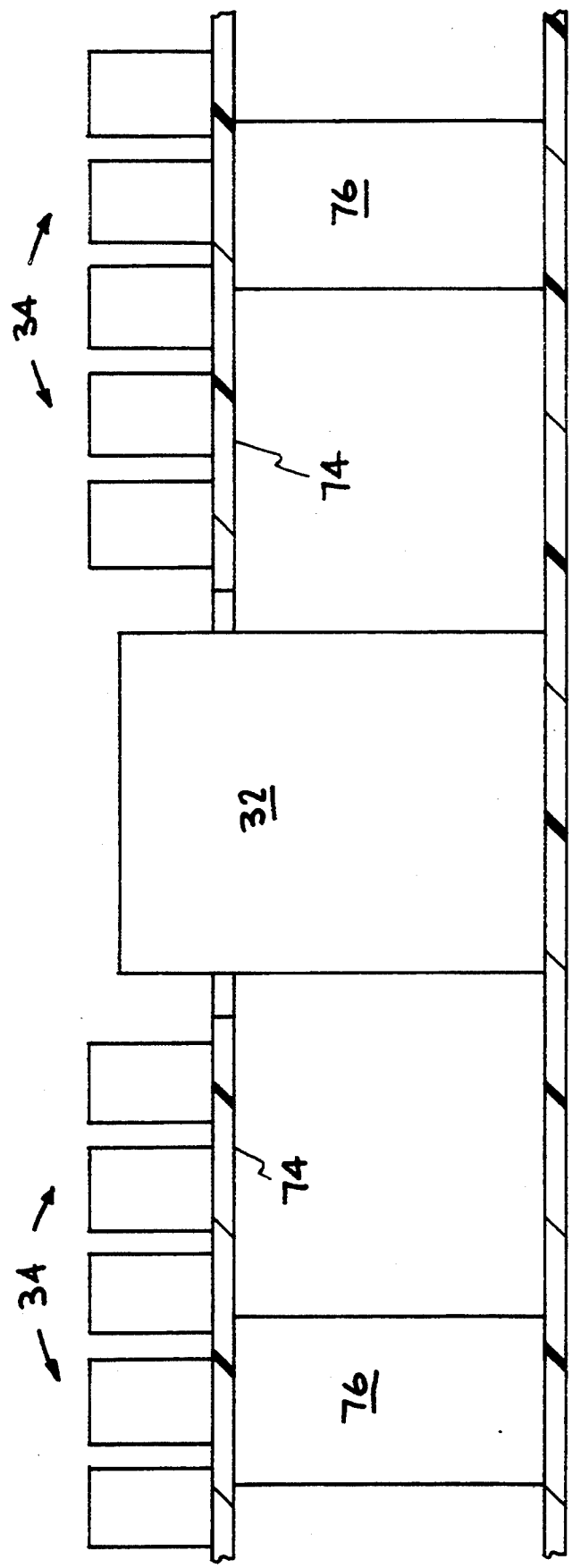
FIG. 3B is a side view of another embodiment of the low voltage assembly taken along line 3B of FIG. 3A in accordance with the present invention.

With reference next to FIG. 3B, a side cut away view of another embodiment of low voltage section 12 of the present invention taken along line 3B of FIG. 3A is shown. In the present embodiment, low voltage module input capacitors 24, not shown, and first stage input capacitors 34 disposed proximate to first stage magnetic switch 32 are mounted in banks to PC boards 74 having heavy, 6 oz., copper cladding. PC boards 74 and capacitors 24, not shown and 34 are elevated using water-cooled support structures 76. In so doing heat generated by low voltage module input capacitors 24, not shown, and first stage input capacitors 34 can be easily removed. Additionally, by elevating capacitors 24, not shown and 34 using water cooled support structures 76, defective capacitor banks can be easily removed and replaced.

Figure 4:
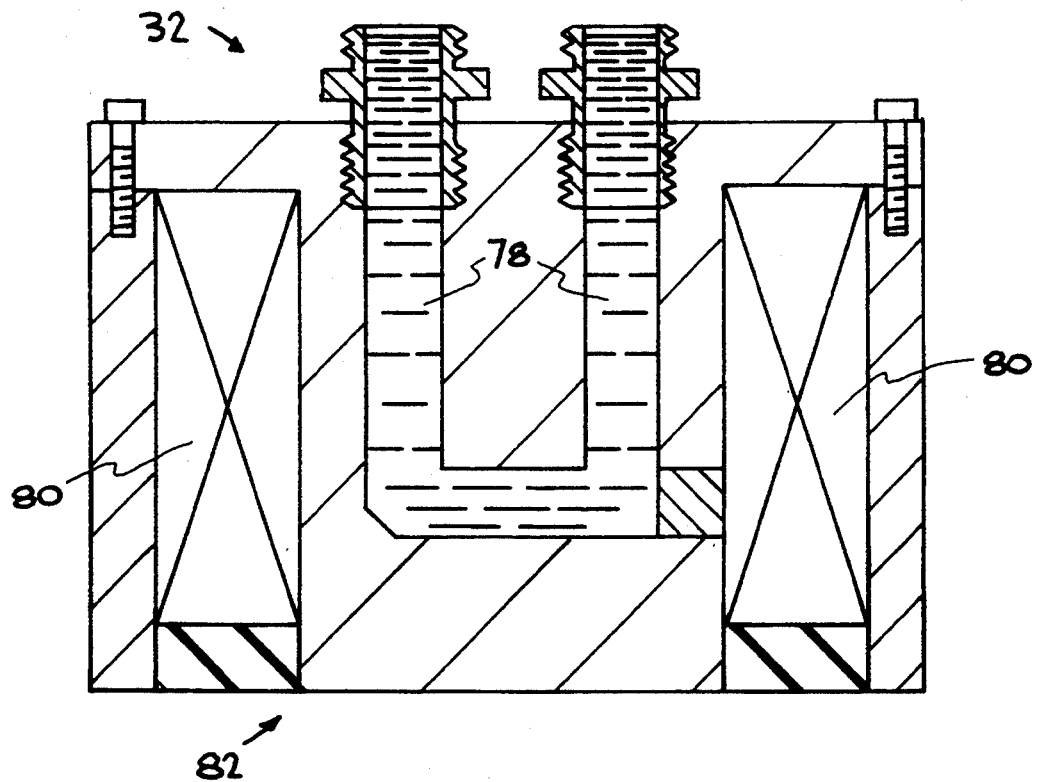
FIG. 4 is side cross sectional view of a first stage switch having cooling channels formed therethrough in accordance with the present invention.

Referring next to FIG. 4, a detailed cut away view of the first stage magnetic switch 32 of FIG. 3A is shown. In the present embodiment, first stage magnetic switch 32 is a single turn structure wound with, for example, Metglas Type 2605 SC magnetic material 80 made by Allied Corporation. Windings 80 of Metglas material are insulated turn-to-turn with 0.1 mil thick Mylar plastic film. The output of first stage magnetic switch 32 connects to a PC board at 82 which in turn acts as the input to primary winding 20 of the pulse transformer 22 of FIG. 1. First stage magnetic switch 32 has cooling channels 78 formed therethrough. Cooling of first stage magnetic switch 32 is accomplished by flowing a coolant such as, for example, water through cooling channels 78 formed through the core mandrel of magnetic switch 32.

With reference again to FIG. 4, in the present embodiment, a small amount of oil, not shown, is used as an impregnant within windings 80. The oil increases heat transfer from windings 80 to the center of first stage magnetic switch 32, thereby allowing the excess heat to be removed by water flowing through cooling channels 78. In the present embodiment, cooling water is supplied to cooling channels 78 using flexible tubing. By removing excess heat using cooling water, the present invention eliminates significant discharge of the waste heat into the vicinity immediately surrounding first stage magnetic switch 32

Figure 5:
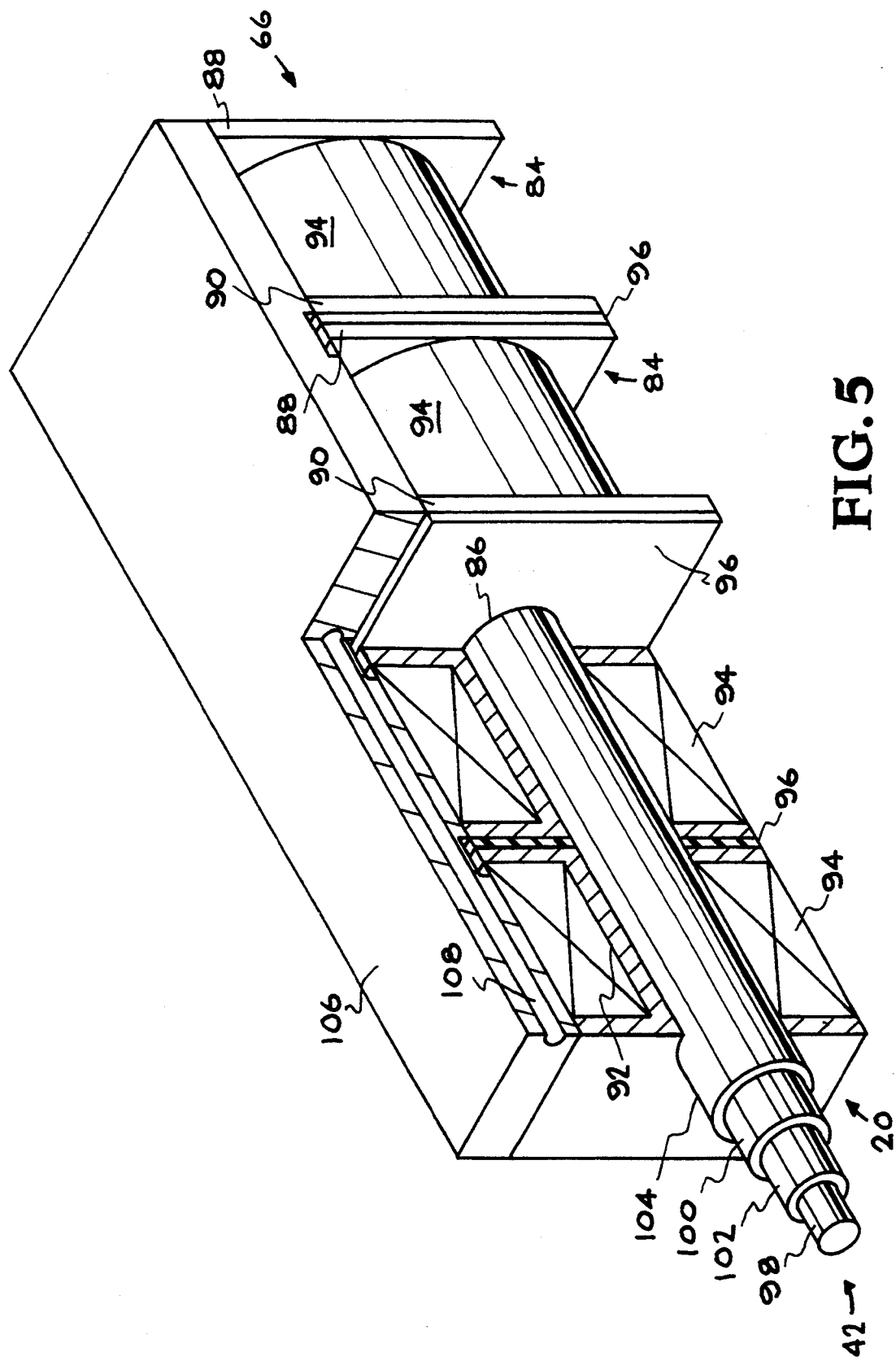
FIG. 5 is a partially cut away perspective view of the physical structure of a pulse transformer in accordance with the present invention.

With reference now to FIG. 5, a partially cut away perspective view of the physical structure of pulse transformer 22 is set forth. As shown in FIG. 5, each primary winding 66 is in the form of an electrically conductive aluminum mandrel 84 which mechanically resembles a spool with a large central hole 86. Electrically, each mandrel 84 is a single turn primary winding 66 with a ground side 88 and a drive side 90 which, with spool body 92, creates a single turn around a toroidal core of the magnetic material 94. Magnetic material 94 is spirally wound onto the spool body 92. The ground and drive ends of adjacent mandrels 88 and 90 are electrically insulated by dielectric inserts 96.

With reference still to FIG. 5, the turns of the secondary winding 42 are formed of a concentric steel rod 98 and tube 100 located on the centerline of the mandrels 84. Turn-to-turn and turn-to-mandrel isolation is provided by glass tubing 102 and 104, respectively. Reset current flowing through the secondary winding 42 provides the appropriate reset for the magnetic material 94 in the pulse transformer. In the present embodiment, transformer 22 has a flexible output configuration permitting unipolar (positive or negative) or bipolar operation. Furthermore, the construction of transformer 22 lends itself to efficient cooling of the conductors and magnetic core material. In addition to the cooling benefits achieved as a result of the construction of the present transformer, the geometry of the multi-primary transformer isolates the high voltage of the secondary winding from the printed circuit board on which the transformer is mounted.

With reference again to FIG. 5, the system used in the present invention to cool transformer 22 is also shown. A cold plate 106 is attached to the primary winding assemblies 20 to carry heat therefrom. Cold plate 106 may be cooled, for example, by flowing cooling water through channels 108 in cold plate 106. In the present embodiment, cooling water is supplied to cold plate 106 using flexible tubing, not shown.

Figure 6:
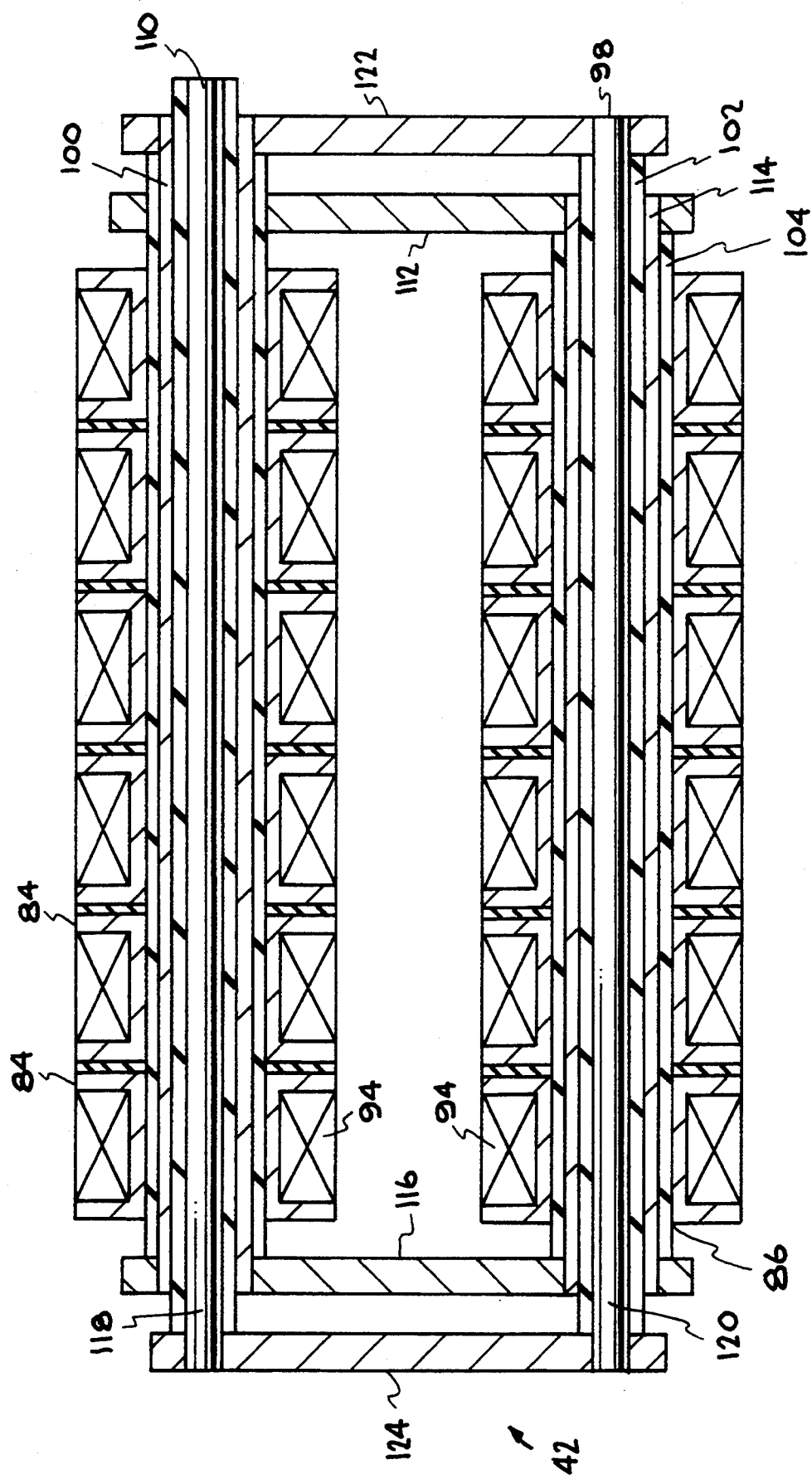
FIG. 6 is a cross sectional view illustrating the connections and interconnections of a pulse transformer in accordance with the present invention.

Referring now to FIG. 6, a cross sectional view of the connections and interconnections of pulse transformer 22 are shown. As described above, glass tubing 102 and 104 is interposed between the inner turns 118 and 120 and the outer turns 100 and 114 of the secondary winding and between outer turns 100 and 114 and mandrel 84. In the configuration of the present embodiment, the glass serves as the high voltage dielectric between secondary turns as well as the insulation between pulse transformer mandrels 84 and secondary winding 42. Glass also serves to regularly position the rods and tubes which form the secondary winding in order to maintain uniform, predictable electric field stress.

With reference still to FIG. 6, in the present embodiment, secondary winding 42 is comprised of tubes 100 and 114, rods 118 and 120, and connecting links 112, 116, 122 and 124. The rods 118 and 120 and tubes 100 and 114 are centered within holes 86 of primary winding mandrels 84. Connecting links 112, 116, 122, and 124 variously connect tubes to tubes, tubes to rods, and rods to rods. High voltage appears between output connections 110 and 112 of secondary winding 42 and is directly proportional to the number of primary winding assemblies 20 that are linked. Either voltage polarity can be obtained by grounding the appropriate end of secondary winding 42.

With reference again to FIG. 6, the first turn of secondary winding 42 of FIG. 1 is configured as two connected tubes 100 and 114 of FIG. 6. As shown in FIG. 6, tubes 100 and 114 traverse the long legs of the rectangular loop within mandrels 84 and are connected to each other by a tube-tube link 116 on a short leg of the loop. The second turn of secondary winding 42 is configured as a first rod 118 and a second rod 120 concentric with tubes 100 and 114 of the first turn, which traverse the same rectangular loop. At one end of the transformer 22, second rod 120 is connected to tube 100 by a tube-rod link 122. At the opposing end, first rod 118 and second rod 120 are connected by a rod-rod link 124. The secondary winding output between 110 and 112 is connected to second stage 38. These connections provide a continuous electrical path which traverses the rectangular loop twice, thereby constituting a two-turn secondary winding.

Figure 7:
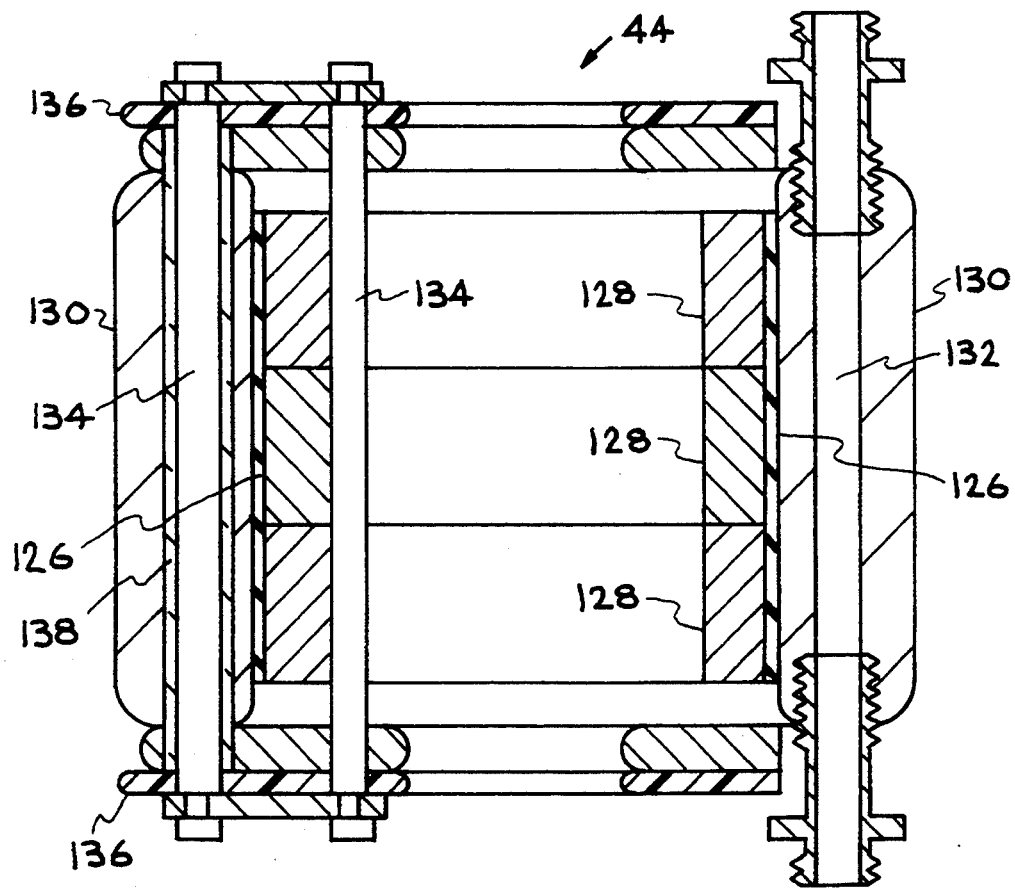
FIG. 7 is a cut away side view of a second stage switch having cooling channels formed therethrough in accordance with the present invention.

Referring now to FIG. 7, a cut away view of second stage magnetic switch 44 of FIG. 1 showing the cooling system of the present invention is shown. Second stage magnetic switch 44 has a structure which allows it to be cooled without immersion in liquid. As shown in FIG. 7, a layer of alumina-doped silicone rubber 126 such as, for example, a product marketed under the trade name Chotherm, is interposed between the ferrite cores 128 and a water-cooled metal housing 130. In the present embodiment, metal housing 130 is formed of aluminum, however, the present invention is also well suited to numerous other types of metal. Layer of Chotherm 126 provides both mechanical isolation and low thermal impedance.

With reference still to FIG. 7, aluminum housing 130 is cooled by flowing cooling water through four individual cooling channels 132 formed through aluminum housing 130. Heat is transferred from ferrite cores 128, where it is generated, through layer of Chotherm 126 into housing 130 and ultimately to the cooling water. To reduce the electrical stress from the windings to housing 130, conductive housing 130 is not grounded and, thus, is allowed to float electrically. Housing 130 floats to approximately one-half of the applied potential, thus reducing the electrical stress by that same factor.

Referring again to FIG. 7, turns of second stage magnetic switch 44 are comprised of cylindrical metal rods 134 positioned on the inner diameter of ferrite cores 128 and within the metal housing 130. Mechanical and electrical connections for the turns are made via a printed circuit board 136 situated on both the top and bottom of second stage magnetic switch 44. In the present embodiment, rods 134 are insulated from housing 130 by glass tubing 138. Although glass tubing 138 is used to insulate rods 134 from housing 130 in the present embodiment, the present invention is also well suited to numerous other types of insulating/dielectric material. In the present embodiment, cooling water is supplied to cooling channels 132 using flexible tubing, not shown. By removing excess heat using cooling water, the present invention eliminates significant discharge of the waste heat into the vicinity immediately surrounding second stage magnetic switch 44.

Figure 8:
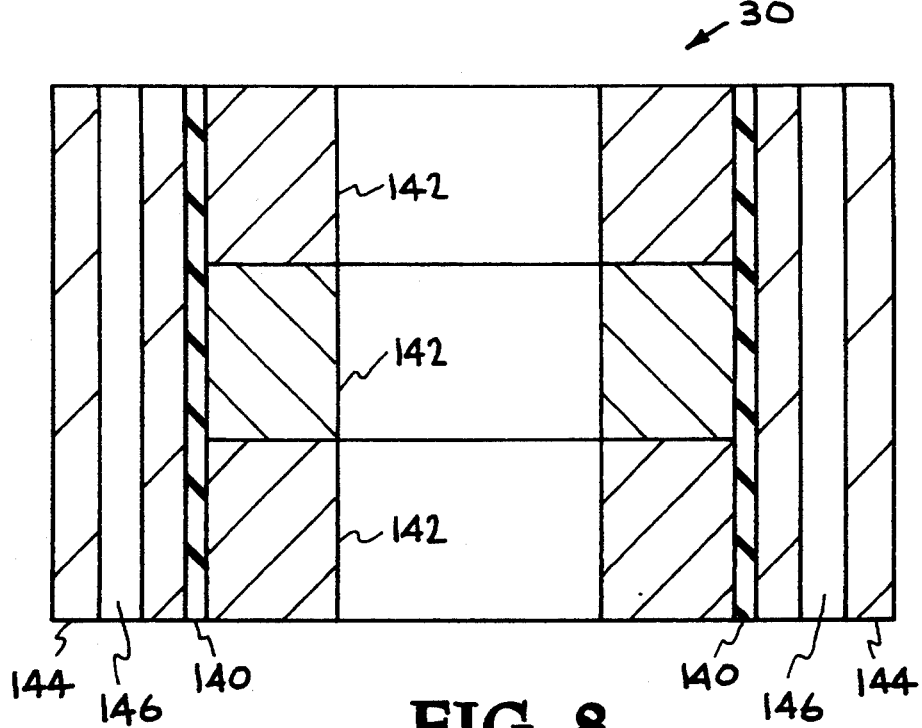
FIG. 8 is a cut away side view of a magnetic assist having cooling channels formed therethrough in accordance with the present invention.

With reference next to FIG. 8, a cut away view of magnetic assist 30 taken along line 8 of FIG. 3A showing the cooling system of the present invention is shown. Magnetic assist 30, like second stage magnetic switch 44 shown in detail in FIG. 7, has a structure which allows it to be cooled without immersion in liquid. As shown in FIG. 8, a layer of alumina-doped silicone rubber 140 such as, for example, Chotherm, is interposed between ferrite cores 142 and a water-cooled metal housing 144. In the present embodiment, metal housing 144 is formed of aluminum, however, the present invention is also well suited to numerous other types of metal.

With reference still to FIG. 8, aluminum housing 144 is cooled by flowing cooling water through cooling channels 146 formed through aluminum housing 144. Heat is transferred from ferrite cores 142, where it is generated, through layer of Chotherm 140 into housing 144 and ultimately to the cooling water. In the present embodiment, cooling water is supplied to cooling channels 146 using flexible tubing, not shown. By removing excess heat using cooling water, the present invention eliminates significant discharge of the waste heat into the vicinity immediately surrounding magnetic assist 30.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A compact high power magnetic compression device comprising:
   a printed circuit board,
   a first magnetic switch mounted on said printed circuit board, said first magnetic switch including first cooling means for removing heat from said first magnetic switch,
   a pulse transformer mounted on said printed board, said pulse transformer coupled to said first magnetic switch, said pulse transformer including second cooling means for removing heat from said pulse transformer, and
   a second magnetic switch electrically coupled to said pulse transformer, said second magnetic switch including third cooling means for removing heat from said second magnetic switch.

2. The compact high power magnetic compression device of claim 1 further comprising:
   a magnetic assist mounted to said printed circuit board, said magnetic assist electrically coupled to said first magnetic switch, said magnetic assist including fourth cooling means for removing heat from said magnetic assist.

3. The compact high power magnetic compression device of claim 2 wherein said fourth cooling means further comprises:
   a metallic housing disposed around the outer diameter of a magnetic core of said magnetic assist,
   a thermally conductive dielectric material disposed between said metallic housing and said magnetic core such that heat generated by said magnetic core will be transferred to said metallic housing,
   cooling channels formed through said metallic housing, and
   means for flowing coolant through said cooling channels formed through said metallic housing such that said heat transferred from said magnetic core to said metallic housing is removed from said metallic housing by said coolant flowing through said cooling channels.

4. The compact high power magnetic compression device of claim 1 wherein said compact high power magnetic compression device does not require immersion in a dielectric/coolant fluid.

5. The compact high power magnetic compression device of claim 1 wherein said first cooling means further comprises:
   oil impregnated within windings of a magnetic core of said first magnetic switch, said windings disposed around a mandrel,
   cooling channels formed through said mandrel of said magnetic core of said first magnetic switch, and
   means for flowing coolant through said cooling channels formed through said mandrel of said magnetic core of said first magnetic switch such that heat transferred from said oil impregnated windings of said magnetic core into said mandrel is removed from said mandrel by said coolant flowing through said cooling channels.

6. The compact high power magnetic compression device of claim 1 wherein said pulse transformer is further comprised of:
   a plurality of electrically conductive mandrels, wherein adjacent said electrically conductive mandrels are magnetically coupled to and electrically insulated from each other.

7. The compact high power magnetic compression device of claim 6 wherein said second cooling means further comprises:
   cold plate means coupled to each of said plurality of electrically conductive mandrels for removing heat from each of said electrically conductive mandrels.

8. The compact high power magnetic compression device of claim 1 wherein said third cooling means further comprises:
   a metallic housing disposed around the outer diameter of a magnetic core of said second magnetic switch, said metallic housing containing therein electrically conductive rods for conducting current along a path on said outer diameter of said magnetic core, said electrically conductive rods insulated from said metallic housing,
   a thermally conductive dielectric material disposed between said metallic housing and said magnetic core such that heat generated by said magnetic core will be transferred to said metallic housing,
   cooling channels formed through said metallic housing, and
   means for flowing coolant through said cooling channels formed through said metallic housing such that said heat transferred from said magnetic core to said metallic housing is removed from said metallic housing by said coolant flowing through said cooling channels.

9. The compact high power magnetic compression device of claim 1 further comprising:
   capacitor banks mounted to water cooled support structures, said water cooled support structures coupled to said printed circuit board.

10. A compact high power water cooled magnetic compression device comprising:
    a printed circuit board,
    a first magnetic switch mounted on said printed circuit board,
    a magnetic assist mounted to said printed circuit board, said magnetic assist electrically coupled to said first magnetic switch,
    a pulse transformer mounted on said printed board, said pulse transformer coupled to said first magnetic switch, and
    a second magnetic switch electrically coupled to said pulse transformer,
    cooling means for flowing coolant through portions of said first magnetic switch, said magnetic assist, said pulse transformer, and said second magnetic switch of a magnetic compression device such that said magnetic compression device can be operated without being immersed in dielectric/coolant fluid.

11. The compact high power water cooled magnetic compression device of Claim 10 further comprising:
capacitor banks mounted water cooled support structures, said water cooled support structures coupled to said printed circuit board.

12. A compact high power magnetic compression device comprising:
a printed circuit board,
a first magnetic switch mounted on said printed circuit board, said first magnetic switch including first cooling means for removing heat from said first magnetic switch, said first cooling means further comprising;
oil impregnated within windings of a magnetic core of said first magnetic switch, said windings disposed around a mandrel,
cooling channels formed through said mandrel of said magnetic core of said first magnetic switch, and
means for flowing coolant through said cooling channels formed through said mandrel of said magnetic core of said first magnetic switch such that heat transferred from said oil impregnated windings of said magnetic core into said mandrel is removed from said mandrel by said coolant flowing through said cooling channels,
a pulse transformer mounted on said printed board, said pulse transformer comprised of a plurality of electrically conductive mandrels, wherein adjacent said electrically conductive mandrels are magnetically coupled to and electrically insulated from each other, said pulse transformer coupled to said first magnetic switch, said pulse transformer including second cooling means for removing heat from said pulse transformer, said second cooling means further comprising;
cold plate means coupled to each of said plurality of electrically conductive mandrels for removing heat from each of said electrically conductive mandrels,
a magnetic assist mounted to said printed circuit board, said magnetic assist electrically coupled to said first magnetic switch, said magnetic assist including third cooling means for removing heat from said magnetic assist, said third cooling means further comprising;
a metallic housing disposed around the outer diameter of a magnetic core of said magnetic assist,
a thermally conductive dielectric material disposed between said metallic housing and said magnetic core such that heat generated by said magnetic core will be transferred to said metallic housing,
cooling channels formed through said metallic housing, and
means for flowing coolant through said cooling channels formed through said metallic housing such that said heat transferred from said magnetic core to said metallic housing is removed from said metallic housing by said coolant flowing through said cooling channels, and
a second magnetic switch electrically coupled to said pulse transformer, said second magnetic switch including fourth cooling means for removing heat from said second magnetic switch, said fourth cooling means further comprising;
a metallic housing disposed around the outer diameter of a magnetic core of said second magnetic switch, said metallic housing containing therein electrically conductive rods for conducting current along a path on said outer diameter of said magnetic core, said electrically conductive rods insulated from said metallic housing,
a thermally conductive dielectric material disposed between said metallic housing and said magnetic core such that heat generated by said magnetic core will be transferred to said metallic housing,
cooling channels formed through said metallic housing, and
means for flowing coolant through said cooling channels formed through said metallic housing such that said heat transferred from said magnetic core to said metallic housing is removed from said metallic housing by said coolant flowing through said cooling channels.

13. The compact high power magnetic compression device of claim 12 wherein said compact high power magnetic compression device does not require immersion in a dielectric/coolant fluid.

14. The compact high power magnetic compression device of claim 12 further comprising:
capacitor banks mounted to water cooled support structures, said water cooled support structures coupled to said printed circuit board.

15. A method for forming a compact high power magnetic compression device comprising:
mounting a first magnetic switch on a printed circuit board, said first magnetic switch having first cooling means for removing heat from said first magnetic switch integrally formed therethrough,
mounting a pulse transformer on said printed board, said pulse transformer coupled to said first magnetic switch, said pulse transformer having second cooling means for removing heat from said pulse transformer formed integrally therethrough,
mounting a magnetic assist to said printed circuit board, said magnetic assist electrically coupled to said first magnetic switch, said magnetic assist having third cooling means for removing heat from said magnetic assist, and
electrically coupling a second magnetic switch to said pulse transformer, said second magnetic switch having fourth cooling means for removing heat from said second magnetic switch.

16. The compact high power magnetic compression device formation method recited in claim 15 further comprising the step of:
flowing coolant through said first, second, third, and fourth cooling means of said magnetic compression device such that said magnetic compression device can be operated without being immersed in dielectric/coolant fluid.

17. A compact high power magnetic compression device for use with a metal vapor laser, said compact high power magnetic compression device comprising:
a printed circuit board,
a first magnetic switch mounted on said printed circuit board, said first magnetic switch including first cooling means for removing heat from said first magnetic switch,
a pulse transformer mounted on said printed board, said pulse transformer coupled to said first magnetic switch, said pulse transformer including second cooling means for removing heat from said pulse transformer, and
a second magnetic switch electrically coupled to said pulse transformer, said second magnetic switch including third cooling means for removing heat from said second magnetic switch.

* * * * *